(12) United States Patent  (10) Patent No.: US 7,613,034 B2
Tagami et al.  (45) Date of Patent: Nov. 3, 2009

(54) MAGNETIC MEMORY AND METHOD FOR READING-WRITING INFORMATION FROM-TO MAGNETIC STORAGE ELEMENT

(75) Inventors: Katsumichi Tagami, Tokyo (JP); Toshikazu Hosobuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/891,708

(22) Filed: Aug. 13, 2007

(65) Prior Publication Data

US 2008/0037185 A1  Feb. 14, 2008

(30) Foreign Application Priority Data

Aug. 14, 2006  (JP) .............................. 2006-221145

(51) Int. Cl.
*G11C 11/00* (2006.01)
(52) U.S. Cl. ........................ 365/158; 365/171; 365/173; 365/66
(58) Field of Classification Search ................ 365/158, 365/171, 173, 66
See application file for complete search history.

(56) References Cited

U.S. PATENT DOCUMENTS

| 5,739,988 A | * | 4/1998 | Gill | 360/324.12 |
|---|---|---|---|---|
| 5,741,435 A | * | 4/1998 | Beetz et al. | 252/62.55 |
| 5,748,399 A | * | 5/1998 | Gill | 360/66 |
| 5,828,531 A | * | 10/1998 | Gill | 360/324.12 |
| 6,023,395 A | * | 2/2000 | Dill et al. | 360/324.2 |
| 6,118,624 A | * | 9/2000 | Fukuzawa et al. | 360/324.12 |
| 6,169,646 B1 | * | 1/2001 | Macken et al. | 360/319 |
| 6,493,195 B1 | * | 12/2002 | Hayashi et al. | 360/322 |
| 6,542,340 B1 | * | 4/2003 | Hayashi | 360/322 |
| 6,567,246 B1 | * | 5/2003 | Sakakima et al. | 360/324.11 |
| 6,603,643 B2 | * | 8/2003 | Hoshiya et al. | 360/324.11 |

(Continued)

OTHER PUBLICATIONS

Nikkei Electronics, Jan 20, 2003 (98-105) and partical English translation thereof.

(Continued)

*Primary Examiner*—Viet Q Nguyen
(74) *Attorney, Agent, or Firm*—Porzio, Bromberg & Newman, P.C.

(57) ABSTRACT

A magnetic memory is provided in which the margin between a write current and a read current can be reduced. A magnetic storage element includes: a first magnetic layer in which the direction of magnetization can be reversed; a second magnetic layer in which the direction of magnetization is fixed; and a non-magnetic layer which is interposed between the first and second magnetic layers. The write current and the read current are supplied to the magnetic storage element in the stacking direction thereof through a read-write line. Moreover, a bias line which can apply a bias magnetic field to the first magnetic layer during a reading operation is disposed in the vicinity of the magnetic storage element.

19 Claims, 11 Drawing Sheets

U.S. PATENT DOCUMENTS

| | | | |
|---|---|---|---|
| 6,636,399 B2 * | 10/2003 | Iwasaki et al. | 360/324.12 |
| 6,667,862 B2 * | 12/2003 | Zhu | 360/324.12 |
| 6,747,853 B2 * | 6/2004 | Hayashi et al. | 360/324.12 |
| 6,757,143 B2 * | 6/2004 | Tunayama et al. | 360/324.1 |
| 6,788,500 B2 * | 9/2004 | Baril et al. | 360/324.11 |
| 6,807,031 B2 * | 10/2004 | Macken et al. | 360/317 |
| 6,809,900 B2 * | 10/2004 | Covington | 360/125.01 |
| 6,812,538 B2 * | 11/2004 | Tsang | 257/421 |
| 6,865,109 B2 * | 3/2005 | Covington | 365/173 |
| 6,879,473 B2 * | 4/2005 | Sone et al. | 360/324.12 |
| 6,930,866 B2 * | 8/2005 | Jayasekara | 360/324.2 |
| 7,035,062 B1 * | 4/2006 | Mao et al. | 360/324.2 |
| 7,394,626 B2 * | 7/2008 | Fukumoto et al. | 360/324.2 |
| 7,423,849 B2 * | 9/2008 | Gill | 360/324.11 |

OTHER PUBLICATIONS

Nikkei Microdevices, Aug. 2004 (85-87) and partial English translation thereof.

"Spin-Torque Transfer in batch-fabricated spin-walue magnetic nanojunctions," J.Z. Sun, D.J. Monsma, T.S. Kuan, M.J. Rooks, D.W. Abraham, B. Oezyilmaz, A.D. Kent, and R.H. Koch, J. Appl. Phys., vol. 93, No. 10, Parts 2&3, May 15, 2003.

"Spin Pumping in Ferromagnetic-Metal/Normal-Metal Junctions, S. Mizukami," Y. Ando and T. Miyazaki, Journal of Magnetics Society of Japan, vol. 27, No. 9, 2003.

* cited by examiner (A)

(B)

US 7,613,034 B2

MAGNETIC MEMORY AND METHOD FOR READING-WRITING INFORMATION FROM-TO MAGNETIC STORAGE ELEMENT

BACKGROUND OF THE INVENTION

1. Field of the Invention

The present invention relates to a magnetic memory from and/or to which information is read and/or written using magnetism, and in particular, to an information reading-writing technology suitable for reversing magnetization utilizing electron spins.

2. Description of the Related Art

In recent years, MRAM (Magnetic Random Access Memory) has been receiving attention as a storage device for use in information processing devices such as computers and communication devices. With MRAM, data is stored magnetically, and the direction of magnetization can be maintained without using any electrical means. Volatile memory such as DRAM (Dynamic Random Access Memory) and SRAM (Static RAM) has the disadvantage that information is lost when power failure occurs. However, such a disadvantage can be avoided with MRAM. Furthermore, when compared with conventional non-volatile storage means such as flash EEPROM and hard disk devices, MRAM is superior in terms of access speed, reliability, power consumption, and the like. Therefore, it is believed that MRAM has functions which can replace all the functions of volatile memories such as DRAM and SRAM and of nonvolatile storage means such as flash EEPROM and hard disk devices.

For example, in the development of information devices with the aim of realizing so-called ubiquitous computing which enables information processing at any location, storage devices are required which are adaptable to high-speed processing while power consumption is reduced, and in which loss of information can be avoided even when power failure occurs. MRAM has the potential to meet all these requirements simultaneously and is expected to be employed in a variety of information devices in the future.

In particular, sufficient power supply cannot always be provided in tablets, portable information terminals, and the like which are intended to be carried on a daily basis. Therefore, in order to carry out a large amount of information processing in severe use environments, a further reduction in power consumption during information processing is required even for MRAM, for which low power consumption is expected.

Some examples of the technique for further reducing power consumption in MRAM, being magnetic memories of a spin injection magnetization reversing type are described in, for example, some articles of Nikkei Electronics, 2003, pp. 98-105; Nikkei Microdevices, 2004, pp. 85-87; "Spin-torque transfer in batch-fabricated spin-valve magnetic nanojunctions," J. Z. Sun, D. J. Monsma, T. S. Kuan, M. J. Rooks, D. W. Abraham, B. Oezyilmaz, A. D. Kent, and R. H. Koch, J. Appl. Phys., Vol. 93, No. 10, Parts 2&3, 15 May 2003; "Spin Pumping in Ferromagnetic-Metal/Normal-Metal Junctions, S. Mizukami,"Y. Ando and T. Miyazaki, Journal of Magnetics Society of Japan, Vol. 27, No. 9, 2003, and the like. In the spin injection magnetization reversing type magnetic memory, a current is applied to a main body of a magnetic storage element exhibiting, for example, a tunneling magneto-resistive (TMR) effect in order to directly reverse the magnetization of a free layer by utilizing the spin torque of the electrons. Hence, magnetization reversal is not strongly affected by a demagnetizing field and the like even when the size of the magnetic storage element is reduced, and therefore writing can be performed with a small current.

As shown in FIG. 10, a magnetic memory 500 has a magnetic storage element 501 that is disposed in each storage area (memory cell), and a read-write line 510 that is provided at the opposite ends of the magnetic storage element 501.

The magnetic storage element 501 includes: a first magnetic layer (free layer) 502 in which the direction of magnetization can be reversed; a second magnetic layer (fixed layer) 504 in which the direction of magnetization is fixed; and a non-magnetic layer 506 sandwiched between the first magnetic layer 502 and the second magnetic layer 504. An antiferromagnetic layer 508 is stacked on the outer side of the second magnetic layer 504, and the direction of magnetization of the second magnetic layer 504 is pinned in the direction of an arrow K by the antiferromagnetic layer 508.

As shown in FIG. 11(A), when a write current is applied to the magnetic storage element 501 in the direction shown by the arrow A via the read-write line 510, spin-polarized electrons e with spin oriented in the same direction as the fixed magnetization direction K of the second magnetic layer 504 pass through the second magnetic layer 504 and are injected into the first magnetic layer 502. When the current value exceeds a certain critical value, these electrons e cause a magnetization reversal such that the magnetization direction G of the first magnetic layer 502 is oriented in the same direction as the magnetization direction K of the second magnetic layer 504.

Meanwhile, when a write current is applied to the magnetic storage element 501 in the direction of the arrow B, as shown in FIG. 11(B), the electrons e pass through the first magnetic layer 502. Among these electrons, electrons e with spin oriented opposite to the fixed magnetization direction K of the second magnetic layer 504 are reflected away from the boundary between the non-magnetic layer 506 and the second magnetic layer 504. However, electrons e with spin oriented in the same direction as the fixed magnetization direction K pass through the second magnetic layer 504 and flow out of the magnetic storage element 501. Therefore, the electrons e that are spin-polarized in the opposite direction to the fixed magnetization direction K are concentrated in the first magnetic layer 502. Hence, these electrons e cause a magnetization reversal such that the magnetization direction G of the first magnetic layer 502 is oriented in the opposite direction to the magnetization direction K of the second magnetic layer 504.

In the magnetic storage element 501, the resistance value is different depending on whether the direction of magnetization of the first magnetic layer 502 is parallel or antiparallel to that of the second magnetic layer 504. The resistance value of the magnetic storage element 501 can be detected by applying a read current to the read-write line 510, and a binary value can be read by utilizing the difference between the states shown in FIGS. 11(A) and (B).

In the magnetic memory 500, the magnetization state of the first magnetic layer 502 can be directly reversed by applying a write current to the magnetic storage element 501. Hence, the write current value can be reduced.

However, in the structure of the magnetic memory 500 of the spin injection magnetization reversal type, both a read current and a write current must be applied to the magnetic storage element 501 through the same passage. Therefore, the difference (margin) between the read and write currents must be set to be a large value by increasing the write current value and decreasing the read current value. This is because when the margin is too small, even the read current may cause accidental writing. Specifically, the read current value must be set to one half or less, and desirably one tenth or less of the write current value.

For example, when the write current is set to 1 mA, the read current must be reduced to approximately 100 µA. Furthermore, when the write current is reduced to 100 µA, as may be possible in the near future, the read current will therefore need to be set to approximately 10 µA. However, since it is difficult to increase the read sensitivity of the magnetic storage element 501, it is difficult to correctly detect the resistance value of the magnetic storage element 501 by applying a weak read current.

Therefore, although the reduction of the write current can be achieved technically, the write current must be set to a relatively large value in order to prevent accidental writing (magnetization reversal of the free layer) during the read operation. Hence, there is a limit to the reduction in current consumption.

SUMMARY OF THE INVENTION

The present invention has been developed in view of the above circumstances, and it is an object of the present invention to provide a magnetic memory from and/or to which information can be read and/or written stably and reliably while a reduction in the write current is achieved.

The present inventors have undertaken intensive studies and have achieved a reduction in the margin between a write current and a read current by applying a bias magnetic field for reading to a magnetic storage element. To achieve the aforementioned object, a first aspect of the present invention is a magnetic memory including: a magnetic storage element including a first magnetic layer in which a direction of magnetization can be reversed, a second magnetic layer in which a direction of magnetization is fixed, and a non-magnetic layer which is interposed between the first magnetic layer and the second magnetic layer; a read-write line which supplies a write current and a read current in a stacking direction of the magnetic storage element; and a bias line which is disposed in the vicinity of the magnetic storage element and applies a bias magnetic field to the first magnetic layer during reading.

To achieve the aforementioned object, a second aspect of the present invention is the magnetic memory according to the aforementioned aspect, wherein a direction of the bias magnetic field is set along an easy magnetization axis of the first magnetic layer.

To achieve the aforementioned object, a third aspect of the present invention is the magnetic memory according to the aforementioned aspects, wherein a direction of the bias magnetic field is set to a direction that is opposite to the direction of magnetization reversal of the first magnetic layer due to the read current.

To achieve the aforementioned object, a fourth aspect of the present invention is the magnetic memory according to the aforementioned aspects, wherein the magnetic storage element further includes: a third magnetic layer which is disposed on a side opposite to the second magnetic layer side of the first magnetic layer; and a non-magnetic layer disposed between the first magnetic layer and the third magnetic layer.

To achieve the aforementioned object, a fifth aspect of the present invention is the magnetic memory according to the aforementioned aspects, wherein a direction of magnetization of the third magnetic layer is fixed and wherein the direction of the bias magnetic field is set to a direction that is opposite to the direction of magnetization of the third magnetic layer.

To achieve the aforementioned object, a sixth aspect of the present invention is the magnetic memory according to the aforementioned aspects, further comprising a yoke which surrounds the bias line in at least the vicinity of the magnetic storage element.

To achieve the aforementioned object, a seventh aspect of the present invention is the magnetic memory according to the aforementioned aspects, wherein a direction of the bias magnetic field is set to a direction that is opposite to the spin-polarized direction of electrons in the first magnetic layer due to the read current.

To achieve the aforementioned object, a eighth aspect of the present invention is a method for reading-writing information from-to a magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising: during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element.

To achieve the aforementioned object, a ninth aspect of the present invention is the method for reading-writing information from-to a magnetic storage element according to the aforementioned aspect, wherein a direction of the bias magnetic field is set to a direction that is opposite to the direction of magnetization reversal of the first magnetic layer due to the read current.

To achieve the aforementioned object, a tenth aspect of the present invention is the method for reading-writing information from-to a magnetic storage element according to the aforementioned aspects, wherein the bias magnetic field is not applied during the writing operation.

To achieve the aforementioned object, a eleventh aspect of the present invention is the method for reading-writing information from-to a magnetic storage element according to the aforementioned aspects, wherein a magnetic force of the bias magnetic field is set to be equal to or less than 80% of a magnetic force required for reversing the magnetization of the first magnetic layer.

According to the above means, since the magnetization state of the first magnetic layer during reading operation can be stabilized by utilizing the bias magnetic field, the read current value can be set to a large value. Therefore, a read-write operation can be reliably carried out even when the write current is reduced and the margin between the read and write currents is set to a small value.

The present invention can provide the advantageous effects in which the read current can be increased even when the write current is reduced, and therefore, accidental writing during a read operation can be reduced.

DETAILED DESCRIPTION OF THE PREFERRED EMBODIMENTS

Figure 1:
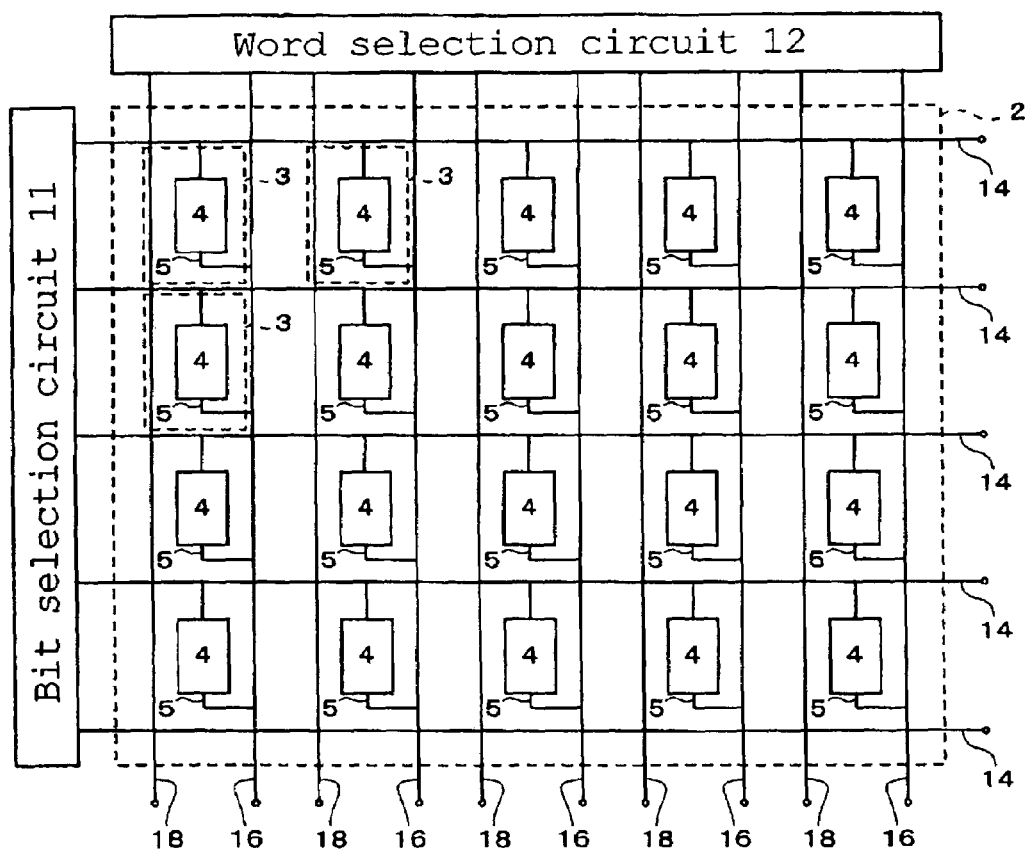
FIG. 1 is a conceptual diagram showing the overall configuration of a magnetic memory according to a first embodiment of the present invention.

Hereinafter, embodiments of the magnetic memory according to the present invention will be described in detail with reference to the accompanied drawings. It should be appreciated that, throughout the drawings, the same components will be designated with identical reference numerals, and redundant description will be omitted.

FIG. 1 is a conceptual diagram showing the overall configuration of a magnetic memory 1 according to a first embodiment of the present invention. The magnetic memory 1 includes a storage unit 2, a bit selection circuit 11, a word selection circuit 12, bit lines 14, word lines 16, and bias lines 18. The storage unit 2 has a plurality of storage areas 3 which are arranged in a two-dimensional array with m rows and n columns (m and n are each an integer of 2 or more). Each of the storage areas 3 has a magnetic storage element 4 and a read-write line 5. The read-write line 5 is disposed so as to connect one of the bit lines 14 with a corresponding one of the word lines 16, and the magnetic storage element 4 is provided at some midpoint of the read-write line 5. Specifically, the read-write line 5 is drawn from the bit line 14 and connected to one end of the magnetic storage element 4. The read-write line 5 is also drawn from the word line 16 and connected to the other end of the magnetic storage element 4.

The magnetic storage element 4 changes its own resistance value due to a TMR effect (Tunneling Magneto-Resistive effect) when the direction of magnetization of a free layer thereinside is changed. Binary data based on the different states of the resistance value is written to the magnetic storage element 4. Moreover, the magnetic storage element 4 is of a spin injection magnetization reversal type. Hence, when a write current is applied to the magnetic storage element 4 using the read-write line 5, the direction of magnetization of the free layer is reversed due to the action from spin-polarized electrons.

One bit line 14 is provided for each of the rows of the array of the plurality of the storage areas 3 and is connected to the read-write line 5 of each of the storage areas 3 in the corresponding row. Similarly, one word line 16 is provided for each of the columns of the array of the plurality of the storage areas 3 and is connected to the read-write line 5 of each of the storage areas 3 in the corresponding column.

Each of the bit selection circuit 11 and the word selection circuit 12 has a function of applying a positive or negative write current and a read current to the read-write line 5 of each of the storage areas 3. Furthermore, the word selection circuit 12 has a function of applying a current to the bias lines 18.

Specifically, the bit selection circuit 11 includes: an address decode circuit for selecting a predetermined row from the array of the storage areas 3 in accordance with an address designated internally or externally; and a current drive circuit for supplying a positive or negative potential to a bit line 14 corresponding to the selected row.

The word selection circuit 12 includes: an address decode circuit for selecting a predetermined column from the array of the storage areas 3 in accordance with the address designated internally or externally; and a current drive circuit for supplying a predetermined voltage to a word line 16 corresponding to the selected column.

Therefore, in order to allow a write or read current to flow through a certain read-write line 5, a row corresponding to the address designated internally or externally is selected by the address decode circuit in the bit selection circuit 11, and a predetermined voltage is applied to the selected bit line 14. At the same time, a column corresponding to the address is selected by the address decode circuit in the word selection circuit 12, and a predetermined voltage is applied to a word line 16 corresponding to the selected column. Hence, a potential difference is generated in the read-write line 5 of the storage area 3 positioned at the cross-point of the selected bit line 14 and the selected word line 16, and therefore a write current or a read current is allowed to flow through the read-write line 5.

One bias line 18 is provided for each of the columns of the array of the plurality of the storage areas 3 and passes in the vicinity of the magnetic storage element 4 of each of the storage areas 3 in the corresponding column. Each bias line 18 is connected to the word selection circuit 12, and a bias current flows therethrough when a potential difference is applied between the opposite ends thereof. Therefore, when the address decode circuit selects a certain column from the array of the storage areas 3 in order to perform a read operation, a current flows through the bias line 18 corresponding to the selected column, whereby a bias magnetic field can be applied to the corresponding magnetic storage elements 4. It should be noted that a current is not applied to any of the bias lines 18 during the write operation.

Figure 2:
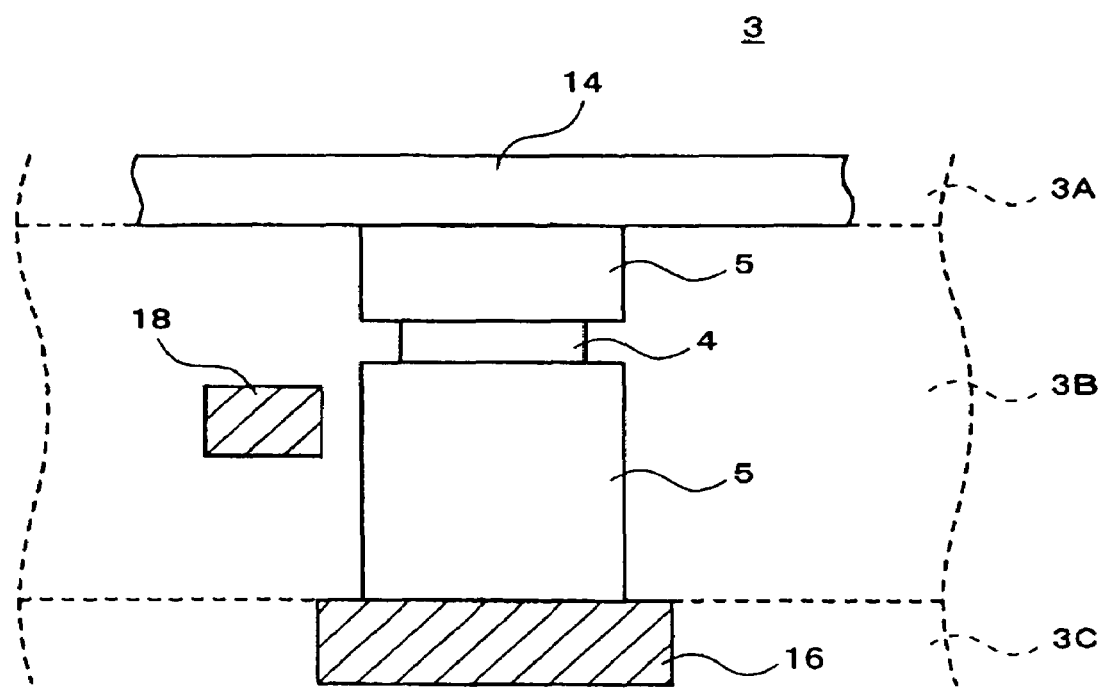
FIG. 2 is an enlarged cross-sectional view showing the internal structure of a storage area of the magnetic memory.

A description will now be given, with reference to the cross-sectional view of FIG. 2, of the specific structure of the storage area 3 in the magnetic memory 1. In the storage area 3, the bit line 14 is formed in an upper layer 3A thereof, and the word line 16 is formed in a lower layer 3C thereof. Furthermore, the bias line 18, the read-write line 5 extending in the vertical direction, and the magnetic storage element 4 are formed in an intermediate layer 3B of the storage area 3. In FIG. 2, the read-write line 5 is branched off in the vertical direction from both the bit line 14 and the word line 16. However, each of the bit line 14 and the word line 16 may directly abut on the magnetic storage element 4. In such a case, each of the bit line 14 and the word line 16 serves as the read-write line. Moreover, the entire region excluding the above components is occupied by an insulating region. An insulating material such as $SiO_2$ is used as the material for the insulating region like that for semiconductor layer. Furthermore, W or Al may be used as the material for wiring lines used in the magnetic memory 1.

Figure 3:
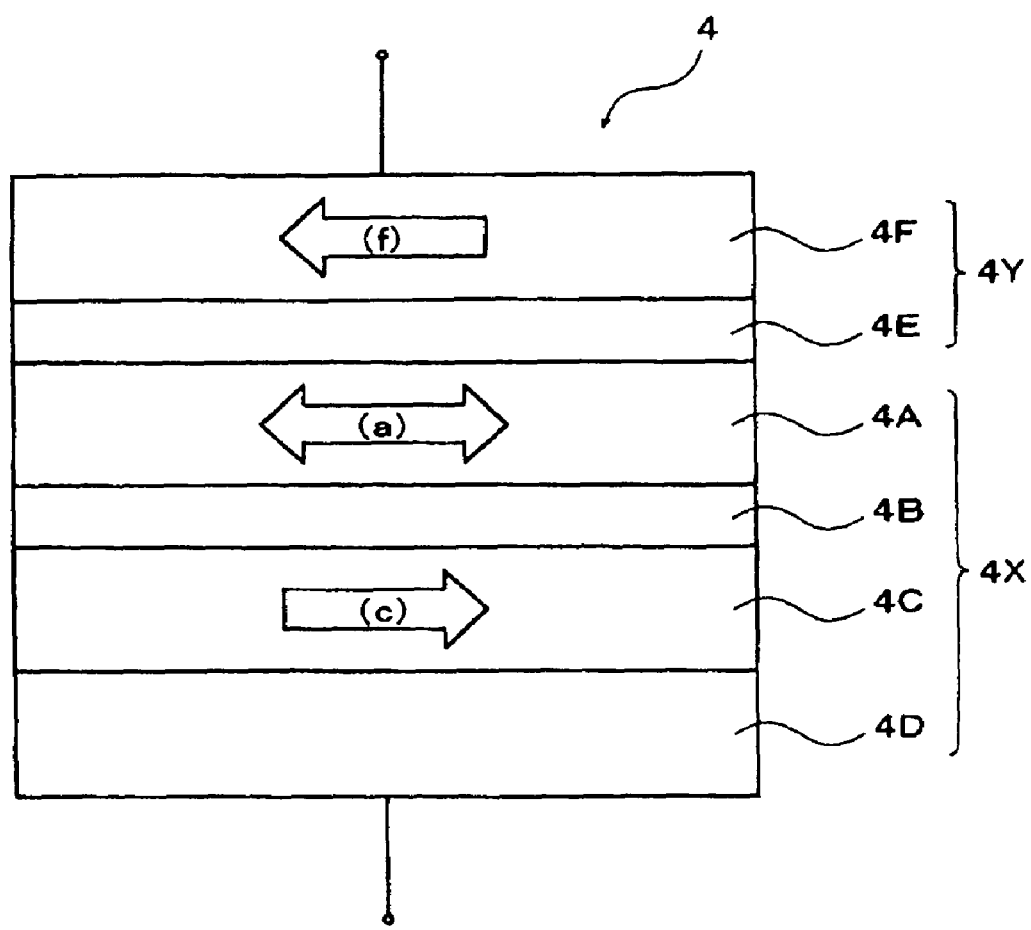
FIG. 3 is an enlarged side view showing the stacking structure of a magnetic storage element disposed in the storage area.

As shown in the enlarged view of FIG. 3, the magnetic storage element 4 includes a stacked memory portion 4X and a stacked filter portion 4Y. The stacked memory portion 4X is constituted by stacking a first magnetic layer (free layer or magnetic sensing layer) 4A, a non-magnetic insulating layer (insulator layer) 4B, a second magnetic layer (fixed layer) 4C, and an antiferromagnetic layer 4D in this order. Furthermore, the stacked filter portion 4Y is disposed on the first magnetic layer 4A side of the stacked memory portion 4X and includes a non-magnetic conductive layer 4E and a filter magnetic layer 4F, in this order, on the first magnetic layer 4A.

In the first magnetic layer 4A, its magnetization direction (a) can be reversed along the easy magnetization axis thereof by the flow of spin-polarized electrons moving in the stacking direction. Furthermore, the magnetization direction (c) of the second magnetic layer 4C is fixed (pinned) by the antiferromagnetic layer 4D so as to be oriented in a predetermined direction. The magnetization direction (c) of the second magnetic layer 4C is oriented along the easy magnetization axis of the first magnetic layer 4A.

As the material for the first magnetic layer 4A, a ferromagnetic material such as Co, CoFe, NiFe, NiFeCo, or CoPt may be used. Furthermore, as the material for the second magnetic layer 4C, a ferromagnetic material such as Co, CoFe, NiFe, NiFeCo, or CoPt, or any combination thereof may be used.

The non-magnetic insulating layer 4B is a layer composed of a non-magnetic and insulative material and is positioned between the first magnetic layer 4A and the second magnetic layer 4C, whereby a tunneling magneto-resistive (TMR) effect is generated. Specifically, the stacked memory portion 4X exhibits a characteristic where the electrical resistance value thereof is different depending on the relative relationship between the magnetization direction (a) of the first magnetic layer 4A and the magnetization direction (c) of the second magnetic layer 4C (i.e., whether the magnetization directions thereof are parallel or antiparallel to each other). As the material for the non-magnetic insulating layer 4B, an oxide or nitride of a metal such as Al, Zn, or Mg may be preferably used. Furthermore, as the material for the antiferromagnetic layer 4D, IrMn, PtMn, FeMn, PtPdMn, or NiO, or any combination thereof may be used. Further to this, the read-write line 5 is electrically connected to the antiferromagnetic layer 4D.

Therefore, in the stacked memory portion 4X, when the magnetization direction (a) of the first magnetic layer 4A is changed by the flow of spin-polarized electrons, the state of the magnetization directions of the first magnetic layer 4A and the second magnetic layer 4C is switched to a parallel state or an antiparallel state, and therefore the resistance value of the stacked memory portion 4X is changed. Hence, binary data can be recorded using the difference in resistance value.

In the stacked filter portion 4Y, the magnetization direction (f) of the filter magnetic layer 4F is oriented along the easy magnetization axis of the first magnetic layer 4A. It should be noted that the magnetization direction (f) is set to be opposite to the magnetization direction (c) of the second magnetic layer 4C. As the material for the filter magnetic layer 4F, a ferromagnetic material such as Co, CoFe, NiFe, NiFeCo, or CoPt, or any combination thereof may be used. As the material for the non-magnetic conductive layer 4E, Ru, Rh, Ir, Cu, Ag, or the like may be preferably used. In the present embodiment, Cu is used. It should be appreciated that the read-write line 5 is electrically connected to the filter magnetic layer 4F.

A description will now be given of an operation for reading-writing information from-to the magnetic storage element 4 of the magnetic memory 1. As a precondition for the following description, it is defined that "1" in binary data is written to the magnetic storage element 4 when the magnetization direction (c) of the second magnetic layer 4C is parallel to the magnetization direction (a) of the first magnetic layer 4A.

Figure 4:
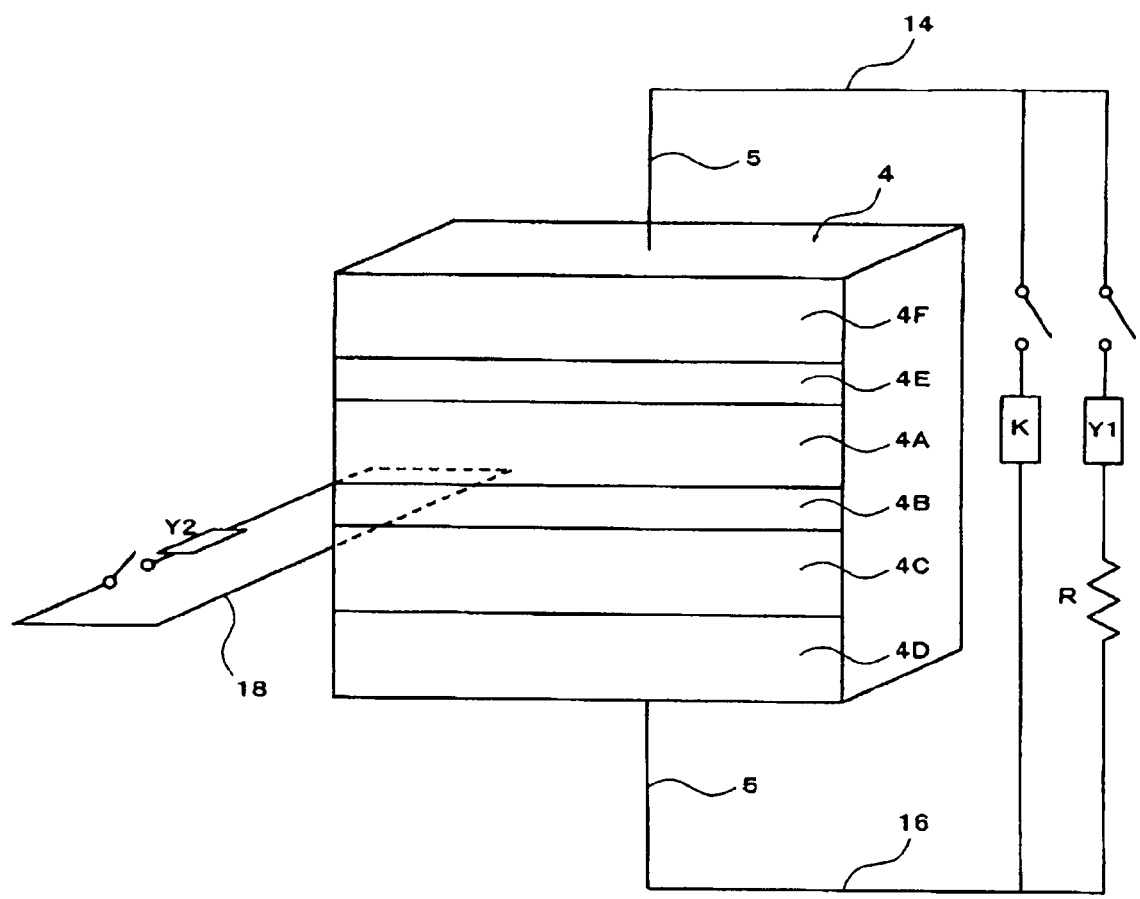
FIG. 4 is a simplified perspective view showing the wiring structure around the magnetic storage element.

FIG. 4 schematically shows peripheral circuits used for reading-writing information from-to the magnetic storage element 4. During a write operation, a voltage K is applied between the bit line 14 and the word line 16 to allow a write current to flow from the filter magnetic layer 4F side or from the antiferromagnetic layer 4D side through the magnetic storage element 4. During a read operation, a voltage Y1 is applied between the bit line 14 and the word line 16 to allow a read current to flow through the magnetic storage element 4, and the resistance value of the magnetic storage element 4 is detected using a detection resistor R. Moreover, during the read operation, a voltage Y2 is applied between the opposite ends of the bias line 18 to apply a bias magnetic field to the magnetic storage element 4.

Figure 5:
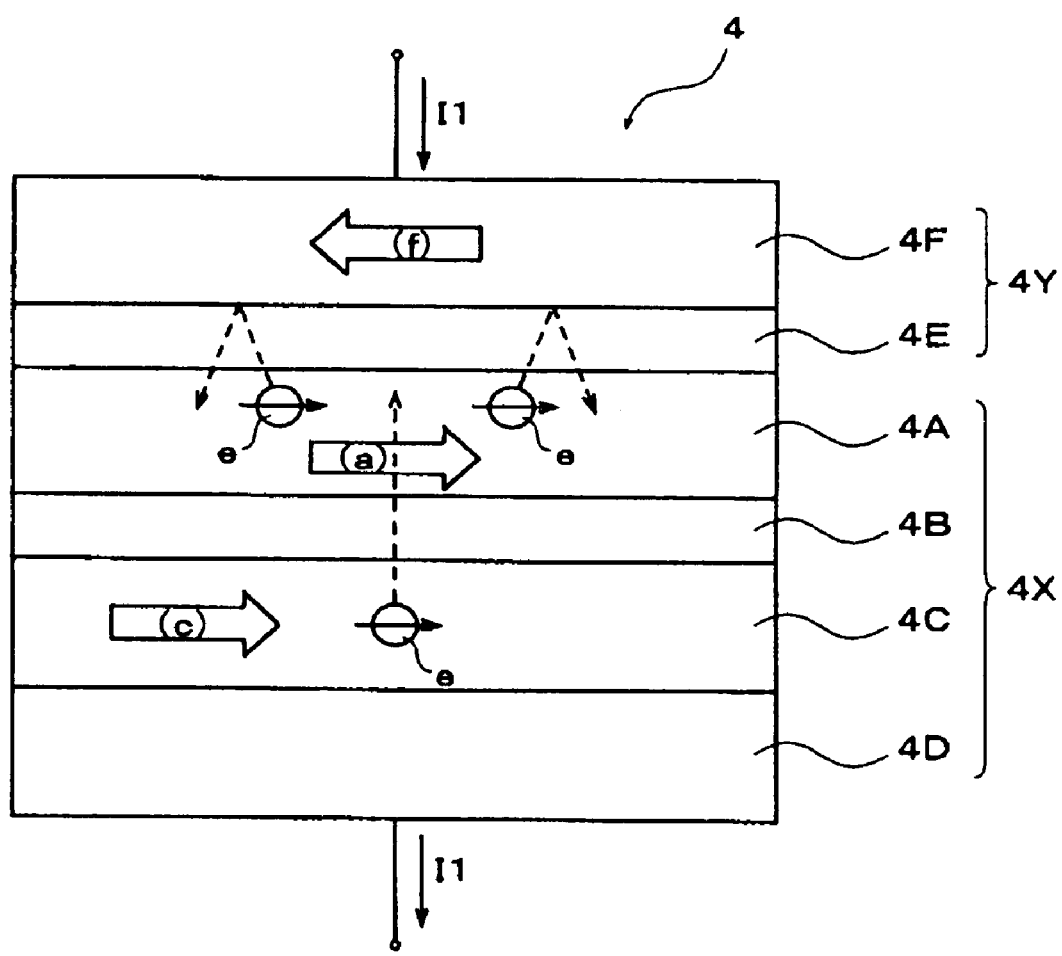
FIG. 5 is a side view showing a magnetization state of the magnetic storage element when a write current I1 is applied to the magnetic storage element.

As shown in FIG. 5, when a write current I1 flows through the read-write line 5 from the stacked filter portion 4Y side of the magnetic storage element 4 toward the stacked memory portion 4X, electrons e are injected from the stacked memory portion 4X side toward the stacked filter portion 4Y side. The spins of these electrons e are oriented in various directions. However, in the second magnetic layer 4C, electrons e with spin oriented in the same direction as the fixed magnetization direction (c) thereof are mainly allowed to pass therethrough, and the other electrons e are reflected away from the second magnetic layer 4C. Therefore, electrons e that are spin-polarized in the fixed magnetization direction (c) are injected into the first magnetic layer 4A. Furthermore, the electrons e having passed through the first magnetic layer 4A are reflected away from the boundary between the non-magnetic conductive layer 4E and the filter magnetic layer 4F in the stacked filter portion 4Y. The boundary between the non-magnetic conductive layer 4E formed of Cu or the like and the filter magnetic layer 4F formed of CoFe or the like exhibits a characteristic where electrons e with spin oriented opposite to the fixed magnetization direction (f) of the filter magnetic layer 4F are selectively reflected away therefrom.

Therefore, electrons e that are spin-polarized in the fixed magnetization direction (c) are concentrated in the first magnetic layer 4A, and therefore the torque from these electrons e causes the magnetization direction of the first magnetic layer 4A to be reversed. Hence, the magnetization direction (a) of the first magnetic layer 4A is brought parallel to the magnetization direction (c) of the second magnetic layer 4C, whereby "1" in binary data is written.

Figure 6:
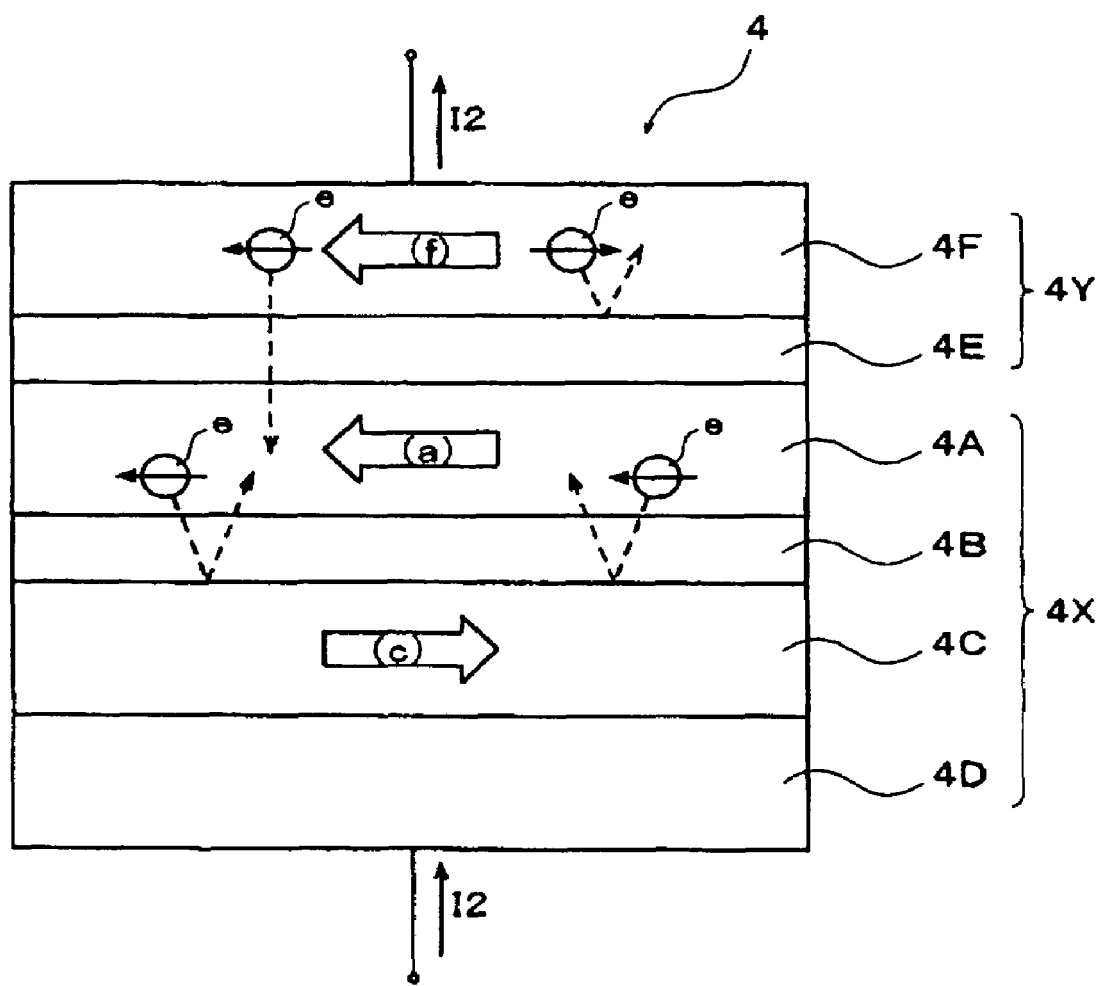
FIG. 6 is a side view showing a magnetization state of the magnetic storage element when a write current I2 is applied to the magnetic storage element.

Next, as shown in FIG. 6, when a write current I2 flows through the read-write line 5 from the stacked memory portion 4X side of the magnetic storage element 4 toward the stacked filter portion 4Y, electrons e are injected from the stacked filter portion 4Y toward the stacked memory portion 4X side. Electrons e with spin oriented opposite to the fixed magnetization direction (f) of the filter magnetic layer 4F are reflected away from the boundary between the filter magnetic layer 4F and the non-magnetic conductive layer 4E, and electrons e with spin oriented in the same direction as the fixed magnetization direction (f) are mainly allowed to pass through the boundary. Therefore, electrons e that are spin-polarized in the same direction as the fixed magnetization direction (f) are injected into the first magnetic layer 4A. Furthermore, these electrons e are reflected away from the second magnetic layer 4C. This is because the second magnetic layer 4C reflects electrons e with spin oriented opposite to the fixed magnetization direction (c) thereof.

Therefore, the electrons e that are spin-polarized in the direction opposite to the fixed magnetization direction (c) are concentrated in the first magnetic layer 4A, and therefore the torque from these electrons e causes the magnetization direction (a) of the first magnetic layer 4A to be reversed. Hence, the magnetization direction (a) of the first magnetic layer 4A is brought antiparallel to the magnetization direction (c) of the second magnetic layer 4C, whereby "0" in binary data is written.

Figure 7:
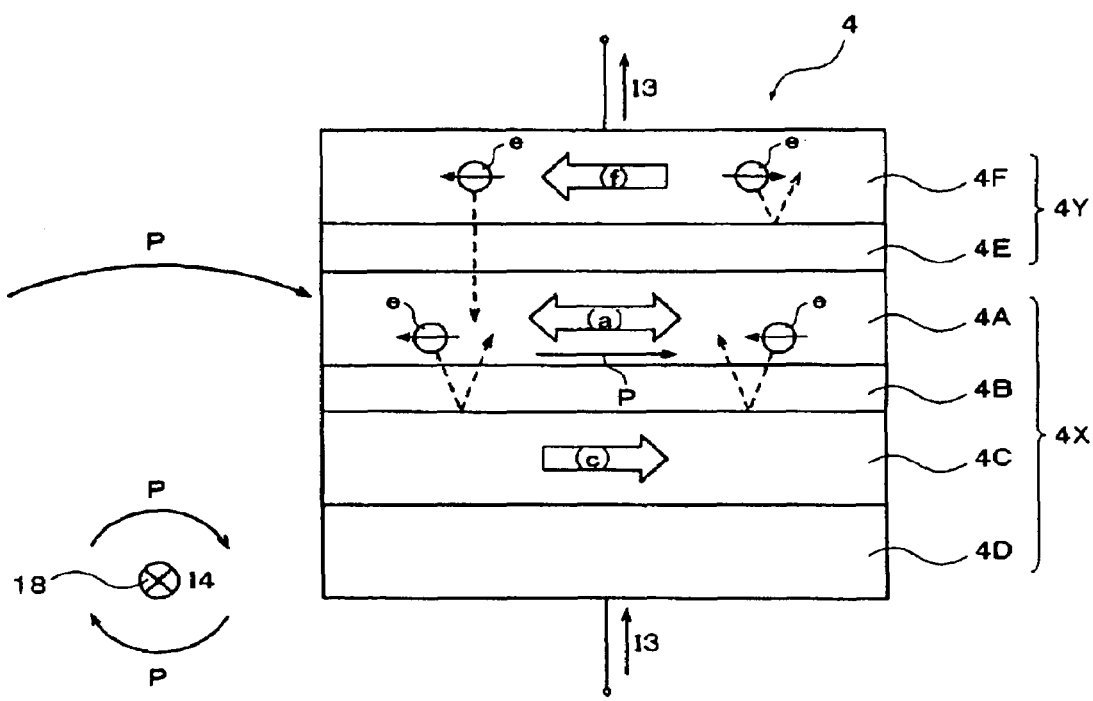
FIG. 7 is a side view showing a magnetization state of the magnetic storage element when a read current I3 is applied to the magnetic storage element.

During a read operation, a read current I3 is applied to the read-write line 5 from the stacked memory portion 4X side of the magnetic storage element 4 to the stacked filter portion 4Y, as shown in FIG. 7. Furthermore, a bias current I4 is applied to the bias line 18 to apply a bias magnetic field P to the first magnetic layer 4A. The resistor R (see FIG. 4) is disposed in the path of the read current I3, and the resistance value of the magnetic storage element 4 is detected using such. For example, when the magnetization direction (a) of the first magnetic layer 4A is the same as the magnetization direction (c) of the second magnetic layer 4C, the resistance value between the first magnetic layer 4A and the second magnetic layer 4C is relatively small due to the tunneling magneto-resistive (TMR) effect in the non-magnetic insulating layer 4B. Conversely, when the magnetization direction (a) is antiparallel to the magnetization direction (c), the resistance value between the first magnetic layer 4A and the second magnetic layer 4C is relatively large due to the tunneling magneto-resistive effect. Therefore, "1" or "0" that has been recorded to the magnetic storage element 4 can be read.

Meanwhile, the read current I3 flows through the magnetic storage element 4 along the same path as that of the write current I2. Therefore, electrons e are injected from the stacked filter portion 4Y toward the stacked memory portion 4X side. Electrons e with spin oriented opposite to the fixed magnetization direction (f) of the filter magnetic layer 4F are reflected away from the boundary between the filter magnetic layer 4F and the non-magnetic conductive layer 4E. However, electrons with spin oriented in the same direction as the fixed magnetization direction (f) are mainly allowed to pass through the boundary and are injected into the first magnetic layer 4A. Hence, in the case where the read current I3 is applied as in the case where the write current I2 is applied, electrons e spin-polarized in the same direction as the fixed magnetization direction (c) are concentrated in the first magnetic layer 4A. Therefore, in the first magnetic layer 4A, the torque from the electrons e in the read current I3 attempts to reverse the magnetization such that the magnetization direction (a) is brought antiparallel to the magnetization direction (c) of the second magnetic layer 4C.

In this embodiment, the bias current I4 is applied to the bias line 18, and the circumferential bias magnetic field P is thereby applied to the first magnetic layer 4A. Specifically, the direction of the bias magnetic field P applied to the first magnetic layer 4A is set parallel to the magnetization direction (c) of the second magnetic layer 4C. As a result, the magnetization state of the first magnetic layer 4A is offset in the same direction as the magnetization direction (c) of the second magnetic layer 4C. As described above, the read current I3 attempts to change the magnetization of the first magnetic layer 4A such that the magnetization direction (a) thereof is brought antiparallel to the magnetization direction (c) of the second magnetic layer 4C. However, the bias magnetic field P attempts to change the magnetization of the first magnetic layer 4A such that the magnetization direction (a) thereof is brought parallel to the magnetization direction (c).

Therefore, the magnetization reversal action of the read current I3 and the magnetization reversal action of the bias magnetic field P cancel each other out.

Moreover, the magnitude of the bias magnetic field P generated by the bias current I4 is adjusted to be equal to or less than 80% of the magnitude of an external magnetic field required for reversing the magnetization direction of the first magnetic layer 4A. Therefore, even when the magnetization state of the first magnetic layer 4A is offset by the bias magnetic field P, the magnetic field in the first magnetic layer 4A is not reversed by the magnetic field P alone.

Figure 8:
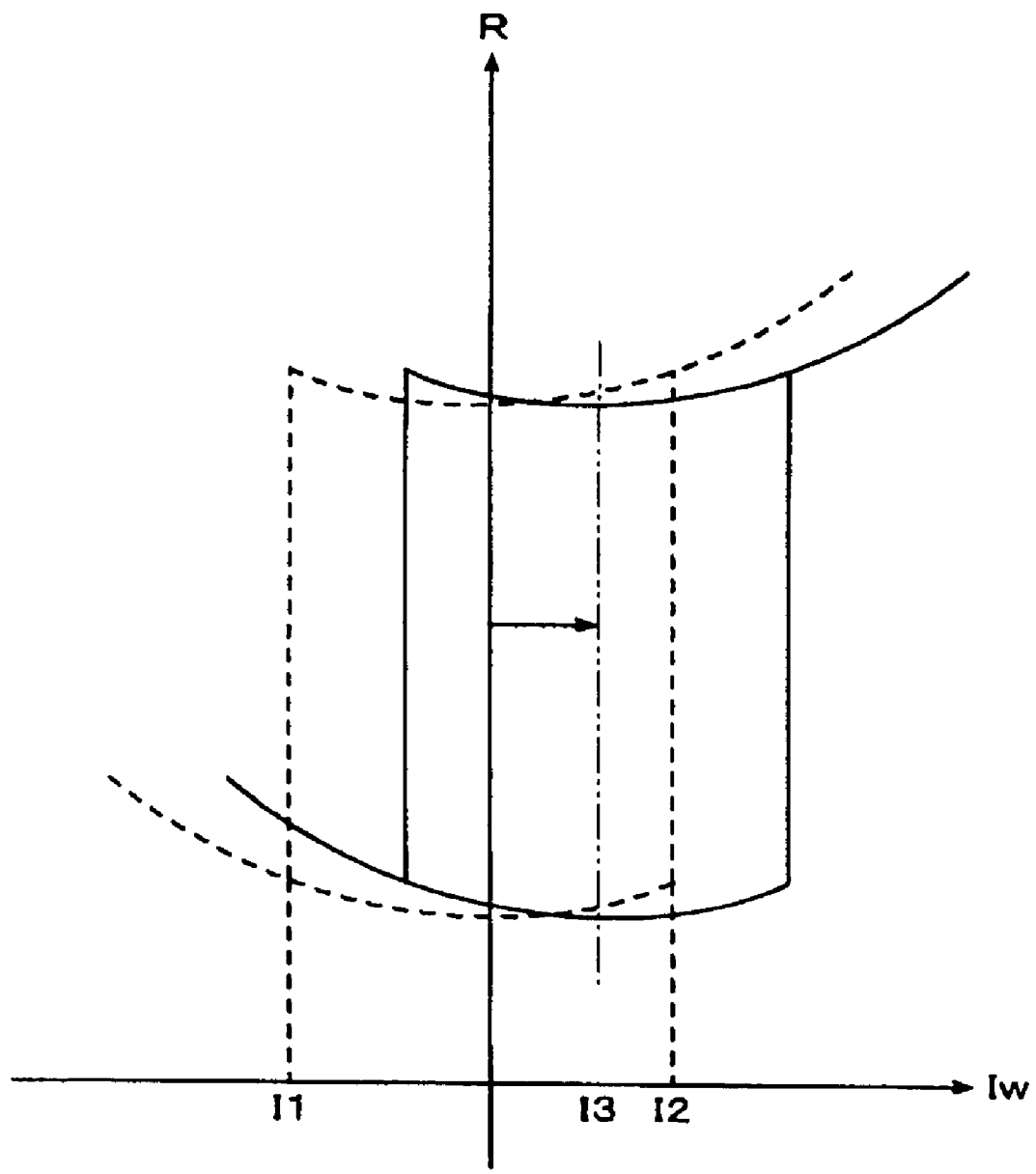
FIG. 8 is a graph showing the current-resistance value change characteristics of the magnetic storage element during a read operation.

The action of the bias magnetic field P is considered in terms of the current value flowing through the read-write line 5. The current value Iw flowing through the read-write line 5 is the current value required to reverse the magnetization direction (a) of the first magnetic layer 4A. As shown in FIG. 8, the current value Iw is shifted by applying the bias magnetic field P. Specifically, in this state, a current flowing from the stacked memory portion 4X side toward the stacked filter portion 4Y side (a current flowing in the same direction as that of the write current I2) is less likely to cause magnetization reversal. However, a current flowing in the opposite direction (a current flowing in the same direction as that of the write current I1) is more likely to cause magnetization reversal.

Therefore, during a read operation, the read current I3 is applied in a direction which is less likely to cause the reversal of the magnetization direction (a) of the first magnetic layer 4A (the same direction as that of the write current I2, or in the direction from the stacked memory portion 4X side toward the stacked filter portion 4Y side). In this manner, the magnetization reversal of the first magnetic layer 4A due to the read current I3 is prevented.

In the magnetic memory 1 of the present embodiment, the bias magnetic field is applied when the read current is applied to the magnetic storage element 4. Therefore, accidental writing caused by the read current can be reduced. In particular, the direction of the bias magnetic field is set along the easy magnetization axis of the first magnetic layer 4A and is set to the direction opposite to the direction of magnetization reversal of the first magnetic layer 4A due to the read current. Therefore, the magnetization reversal action due to the read current can be canceled out by the bias magnetic field. Moreover, in the present embodiment, the magnetic storage element 4 has a structure in which the filter magnetic layer 4F serving as a third magnetic layer is provided through the non-magnetic layer formed of Cu or the like. In this structure, the magnetization reversal action of the read current I3 can be effectively canceled out by applying the bias magnetic field in the direction opposite to the magnetization direction of the filter magnetic layer 4F.

Furthermore, in the magnetic memory 1 of the present embodiment, the magnetic force of the bias magnetic field is set to be equal to or less than 80% of the magnetic force of an external magnetic field which causes the magnetization reversal of the first magnetic layer 4A. Therefore, the bias magnetic field suppresses the magnetization reversal due to the read current I3, and at the same time accidental writing due to the bias magnetic field can be prevented.

Figure 9:
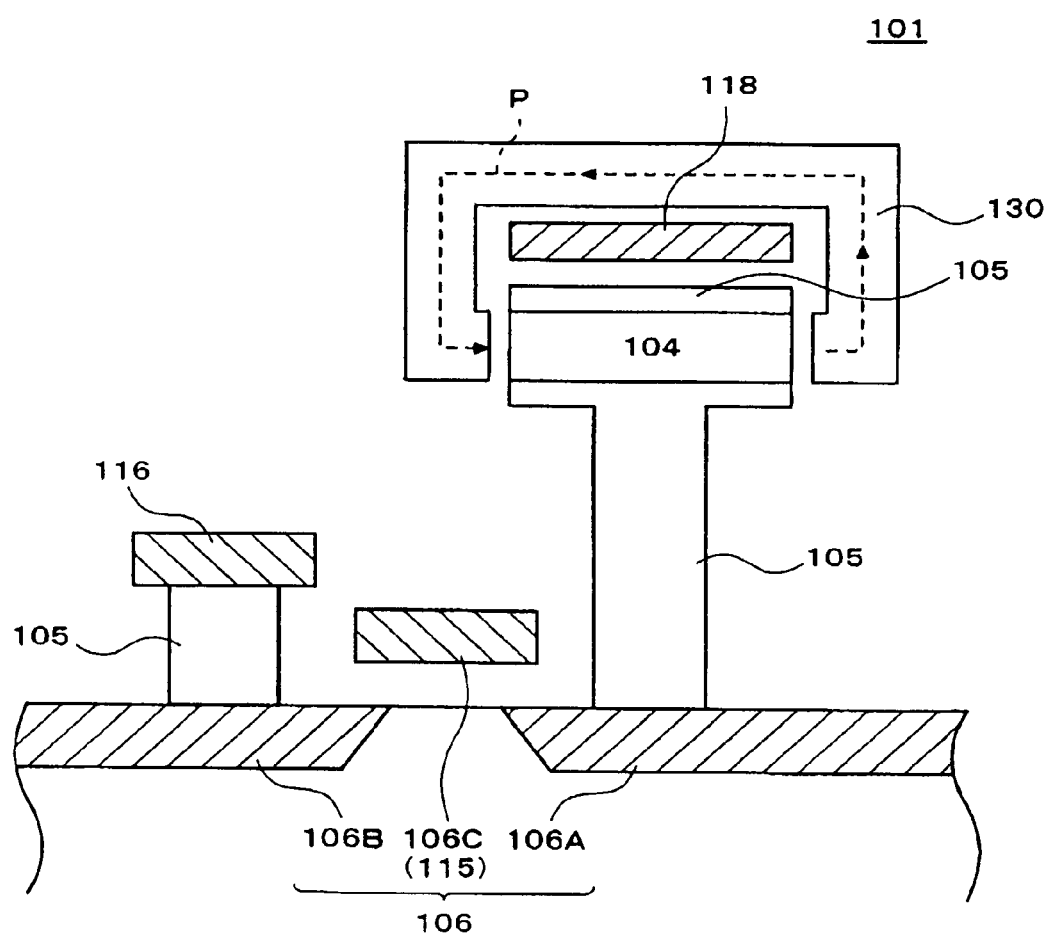
FIG. 9 is an enlarged cross-sectional view showing the structure of a storage area of a magnetic memory according to a second embodiment of the present invention.
Figure 10:
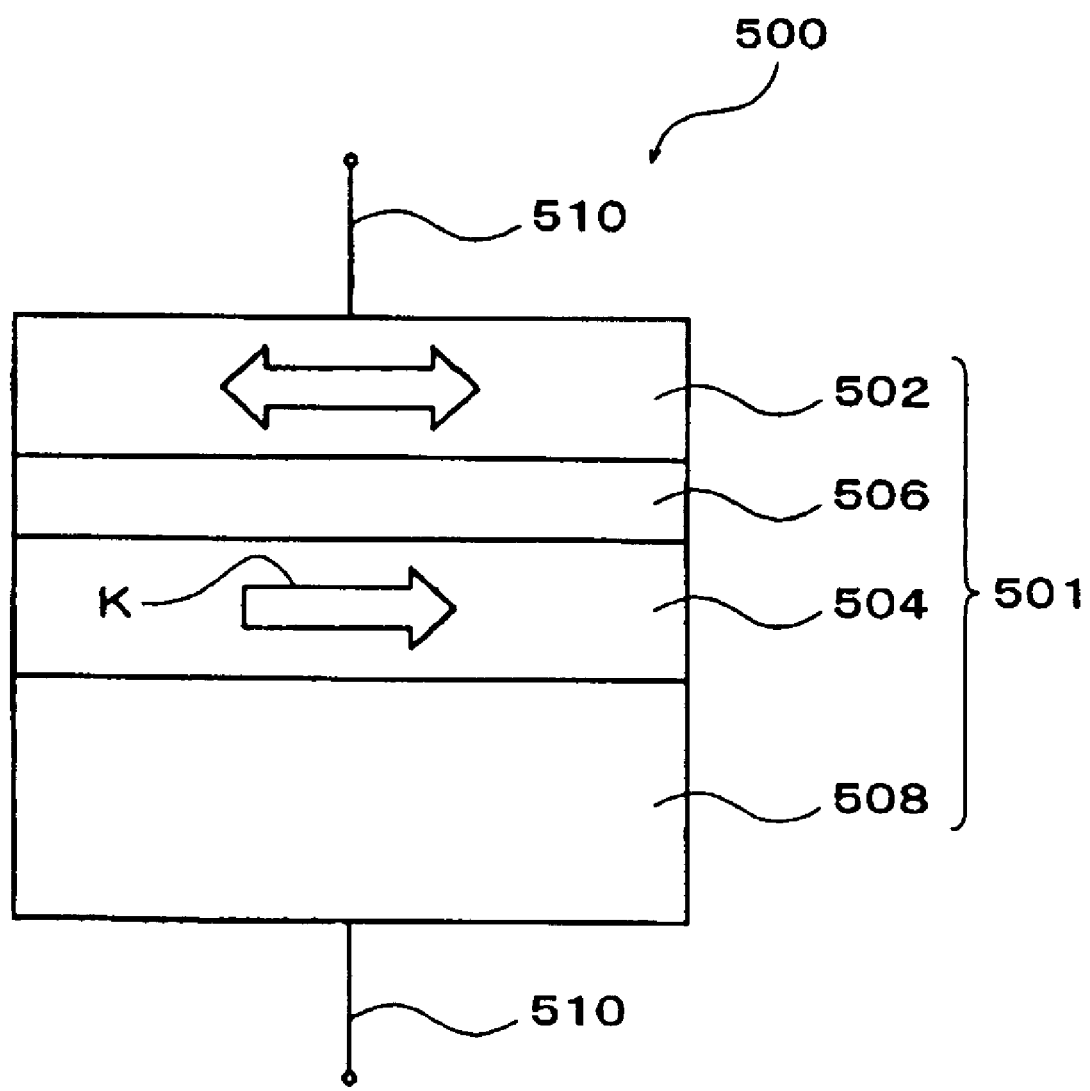
FIG. 10 is a side view schematically showing the structure of a magnetic storage element in a conventional magnetic memory.
Figure 11:
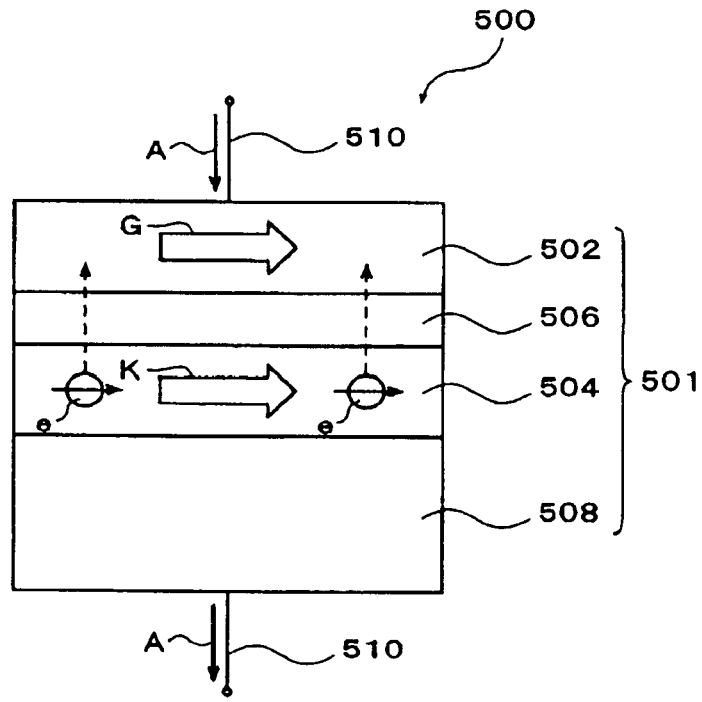
FIGS. 11(A) and 11(B) are side views schematically showing magnetization states of the magnetic storage element in the conventional magnetic memory.
Figure 11:
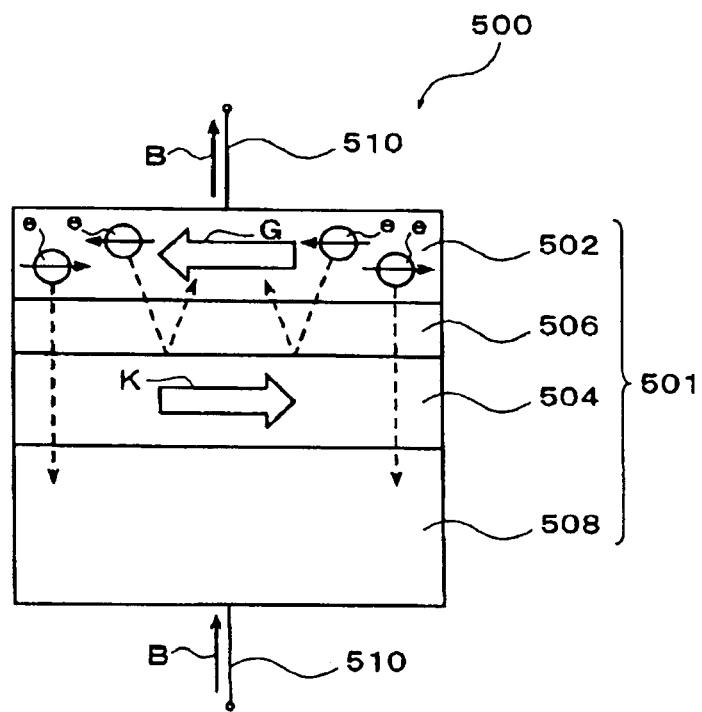

A description will now be given, with reference to FIG. 9, of a magnetic memory 101 of a second embodiment of the present invention. In the following description, the difference between the magnetic memory 101 and the magnetic memory 1 of the first embodiment is mainly described. In the magnetic memory 101, the parts that are the same as or similar to those of the magnetic memory 1 of the first embodiment are designated using the same last two digits as those used for the magnetic memory 1, and a description thereof is omitted accordingly.

In the magnetic memory 101, a transistor 106 is provided in a part of a read-write line 105. The transistor 106 functions as switching means for controlling the conduction (ON-OFF) of a write current and a read current flowing through the read-write line 105. The read-write line 105 is connected to a drain 106A and a source 106B of the transistor 106, and a word line 115 for controlling the transistor is connected to a gate 106C. In order to allow the write current or the read current to flow through the read-write line 105, a current is applied to the word line 115 with a voltage applied between a bit line 114 and a word line 116. Hence, electrical conduction through the transistor 106 is established, and a current therefore flows through the read-write line 105.

Moreover, in the magnetic memory 101, a yoke 130 is formed so as to surround the bias line 118 in the vicinity of the magnetic storage element 104. The yoke 130 enhances the bias magnetic field P generated by the bias line 118 and prevents the leakage of the bias magnetic field P to the outside, and as such, the bias magnetic field P can thereby be concentrated in the magnetic storage element 104.

In the magnetic memory 101 of the second embodiment, the electrical conduction of the current flowing through the read-write line 105 can be structurally controlled by the transistor 106. Therefore, a sneak current and the like can be avoided, so that the read-write precision can be improved. Moreover, since the yoke 130 is formed around the bias line 118, a sufficient bias magnetic field P can be obtained even when the bias current applied to the bias line 118 is reduced. Hence, the current consumption during a reading operation can be reduced.

Although the description has been given of the magnetic memories of the first and second embodiments, the present invention is not limited to these embodiments, and various modifications can be made thereto. In the above embodiments, the TMR element is employed as a magnetic storage element. However, for example, a GMR (Giant Magneto-resistive) element may be used which utilizes a GMR effect. The GMR effect refers to a phenomenon in which the resistance value of two ferromagnetic layers with a nonmagnetic layer interposed therebetween in a direction perpendicular to the stacking direction is changed depending on the angle formed between the magnetization directions of the two ferromagnetic layers. In a GMR element, the resistance value of the ferromagnetic layers is minimized when the magnetization directions of the two ferromagnetic layers are parallel to each other and is maximized when the magnetization directions of the two ferromagnetic layers are antiparallel to each other. Meanwhile, TMR elements and GMR elements both may be classified into: a pseudo spin valve type in which writing and reading are carried out by utilizing the difference in coercivity between two ferromagnetic layers; and a spin valve type in which the direction of magnetization of one of ferromagnetic layers is fixed by means of exchange coupling with an antiferromagnetic layer. In the first and second embodiments, the description has been given only of the wiring line structure in which the bit and word lines are used, but the present invention is not limited thereto. Any other structure can be used so long as a current is allowed to flow in the stacking direction of a magnetic storage element. For example, one end of a read-write line may be grounded so long as the electrical conduction of the current flowing through the read-write line can be controlled in its wiring line structure.

The magnetic memory of the present invention is not limited to those described in the above embodiments. Of course, various modifications may be made without departing from the spirit of the present invention.

The present invention can be widely utilized in the fields in which various types of information are recorded and maintained by means of magnetic storage elements.

The entire disclosure of Japanese Patent Application No. 2006-221145 filed on Aug. 14, 2006 including specification, claims, drawings, and summary are incorporated herein by reference in its entirety.

What is claimed is:

1. A magnetic memory comprising:
   a magnetic storage element including a first magnetic layer in which a direction of magnetization can be reversed, a second magnetic layer in which a direction of magnetization is fixed, and a non-magnetic layer which is interposed between the first magnetic layer and the second magnetic layer;
   a read-write line for supplying a write current and a read current in a stacking direction of the magnetic storage element; and
   a bias line which is disposed in the vicinity of the magnetic storage element and applies a bias magnetic field to the first magnetic layer during reading.

2. The magnetic memory according to claim 1, wherein a direction of the bias magnetic field is set along an easy magnetization axis of the first magnetic layer.

3. A magnetic memory comprising:
   a magnetic storage element including a first magnetic layer in which a direction of magnetization can be reversed, a second magnetic layer in which a direction of magnetization is fixed, and a non-magnetic layer which is interposed between the first magnetic layer and the second magnetic layer;
   a read-write line for supplying a write current and a read current in a stacking direction of the magnetic storage element; and
   a bias line which is disposed in the vicinity of the magnetic storage element and applies a bias magnetic field td the first magnetic layer during reading, wherein a direction of the bias magnetic field is set to a direction that is opposite to the direction of magnetization reversal of the first magnetic layer due to the read current.

4. The magnetic memory according to claims 1, wherein the magnetic storage element further includes: a third magnetic layer which is disposed on said first magnetic layer on a side opposite to the second magnetic layer; and a non-magnetic layer disposed between the first magnetic layer and the third magnetic layer.

5. The magnetic memory according to claim 1, wherein the magnetic storage element further includes: a third magnetic layer which is disposed on said first magnetic layer on a side opposite to the second magnetic layer; and a non-magnetic layer disposed between the first magnetic layer and the third magnetic layer, and wherein a direction of magnetization of the third magnetic layer is fixed and the direction of the bias magnetic field is set to a direction that is opposite to the direction of magnetization of the third magnetic layer.

6. The magnetic memory according to claims 1, further comprising a yoke, said yoke surrounding the bias line in at least the vicinity of the magnetic storage element.

7. The magnetic memory according to claim 1, wherein a direction of the bias magnetic field is set along an easy magnetization axis of the first magnetic layer and the magnetic storage element further includes:

a third magnetic layer which is disposed on said first magnetic layer on a side opposite to the second magnetic layer; and a non-magnetic layer disposed between the first magnetic layer and the third magnetic layer.

8. The magnetic memory according to claim 1, wherein a direction of the bias magnetic field is set to a direction that is opposite to the direction of magnetization reversal of the first magnetic layer due to the read current and wherein the magnetic storage element further includes:

a third magnetic layer which is disposed on said first magnetic layer on a side opposite to the second magnetic layer; and a non-magnetic layer disposed between the first magnetic layer and the third magnetic layer.

9. The magnetic memory according to claim 1, further comprising a yoke, said yoke surrounding the bias line in at least the vicinity of the magnetic storage element and wherein a direction of the bias magnetic field is set along an easy magnetization axis of the first magnetic layer.

10. The magnetic memory according to claims 1, further comprising a yoke, said yoke surrounding the bias line in at least the vicinity of the magnetic storage element and wherein the magnetic storage element further includes:

a third magnetic layer which is disposed on said first magnetic layer on a side opposite to the second magnetic layer; and a non-magnetic layer disposed between the first magnetic layer and the third magnetic layer.

11. A magnetic memory comprising:

a magnetic storage element including a first magnetic layer in which a direction of magnetization can be reversed, a second magnetic layer in which a direction of magnetization is fixed, and a non-magnetic layer which is interposed between the first magnetic layer and the second magnetic layer;

a read-write line for supplying a write current and a read current in a stacking direction of the magnetic storage element; and a bias line which is disposed in the vicinity of the magnetic storage element and applies a bias magnetic field to the first magnetic layer during reading, wherein a direction of the bias magnetic field is set to a direction that is opposite to the spin-polarized direction of electrons in the first magnetic layer due to the read current.

12. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element.

13. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein a direction of the bias magnetic field is set to a direction that is opposite to the direction of magnetization reversal of the first magnetic layer due to the read current.

14. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein the bias magnetic field is not applied during the writing operation.

15. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein a magnetic force of the bias magnetic field is set to be equal to or less than 80% of a magnetic force required for reversing the magnetization of the first magnetic layer.

16. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein a direction of the bias magnetic field is set to a direction that is opposite to the direction of magnetization reversal of the first magnetic layer due to the read current; and the bias magnetic field is not applied during the writing operation.

17. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein a direction of the bias magnetic field is set to a direction that is opposite to the direction of magnetization reversal of the first magnetic layer due to the read current; and a magnetic force of the bias magnetic field is set to be equal to or less than 80% of a magnetic force required for reversing the magnetization of the first magnetic layer.

18. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein the bias magnetic field is not applied during the writing operation; and a magnetic force of the bias magnetic field is set to be equal to or less than 80% of a magnetic force required for reversing the magnetization of the first magnetic layer.

19. A method for reading-writing information from-to a magnetic storage element, the magnetic storage element including a first magnetic layer in which a direction of magnetization can be reversed, a second magnetic layer in which a direction of magnetization is fixed, and a non-magnetic layer which is interposed between the first magnetic layer and the second magnetic layer, the method comprising:

during a writing operation, applying a write current in a stacking direction of the magnetic storage element to generate spin-polarized electrons, whereby the direction of magnetization of the first magnetic layer is reversed by means of the spin-polarized electrons; and during a reading operation, applying a bias magnetic field to the first magnetic layer and further applying a read current in the stacking direction of the magnetic storage element to detect a resistance value of the magnetic storage element, wherein a direction of the bias magnetic field is set to a direction that is opposite to the direction of magnetization reversal of the first magnetic layer due to the read current; the bias magnetic field is not applied during the writing operation;

and a magnetic force of the bias magnetic field is set to be equal to or less than 80% of a magnetic force required for reversing the magnetization of the first magnetic layer.

* * * * *